(12) United States Patent
Lee et al.

(10) Patent No.: US 7,705,764 B2
(45) Date of Patent: Apr. 27, 2010

(54) METHOD OF ALGORITHMIC ANALOG-TO-DIGITAL CONVERSION AND ALGORITHMIC ANALOG-TO-DIGITAL CONVERTER

(75) Inventors: Seung Chul Lee, Daejeon (KR); Jae Won Nam, Daejeon (KR); Young Deuk Jeon, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 10 days.

(21) Appl. No.: 12/198,837

(22) Filed: Aug. 26, 2008

(65) Prior Publication Data

US 2009/0096646 A1    Apr. 16, 2009

(30) Foreign Application Priority Data

Oct. 16, 2007    (KR) ...................... 10-2007-0104108

(51) Int. Cl.
*H03M 1/12*    (2006.01)

(52) U.S. Cl. ........................ 341/172; 341/122; 341/143; 341/155; 341/161; 341/162

(58) Field of Classification Search ......... 341/118–122, 341/143, 155, 161, 162, 172
See application file for complete search history.

(56) References Cited

U.S. PATENT DOCUMENTS

| 6,097,326 | A | 8/2000 | Opris et al. | |
|---|---|---|---|---|
| 6,882,292 | B1 * | 4/2005 | Bardsley et al. | 341/121 |
| 6,967,611 | B2 * | 11/2005 | Atriss et al. | 341/172 |
| 7,009,549 | B1 * | 3/2006 | Corsi | 341/161 |
| 7,068,203 | B2 * | 6/2006 | Maloberti et al. | 341/155 |
| 7,088,275 | B2 * | 8/2006 | Waltari | 341/155 |
| 7,187,310 | B2 * | 3/2007 | El-Sankary et al. | 341/120 |
| 7,265,705 | B1 * | 9/2007 | Lee et al. | 341/162 |

(Continued)

FOREIGN PATENT DOCUMENTS

| KR | 100252647 B1 | 1/2000 |
|---|---|---|
| KR | 10-2006-0044441 A | 5/2006 |

OTHER PUBLICATIONS

Min Gyu Kim et al., "A 10MS/s 11-b 0. 19 mm2 Algorithmic ADC with Improved Clocking", 2006 Symposium on VLSI Circuits Digest of Technical Papers, 2006 IEEE.

(Continued)

*Primary Examiner*—Linh V Nguyen

(57) ABSTRACT

Provided are a method of algorithmic analog-to-digital conversion and an algorithmic Analog-to-Digital Converter (ADC). The algorithmic ADC includes a Multiplying Digital-to-Analog Converter (MDAC). The MDAC includes a Digital-to-Analog Converter (DAC) for converting a first digital signal into an analog signal, a subtractor for calculating a difference between the signal output from the DAC and an analog signal input from a first Sample and Hold Amplifier (SHA), an amplifier for amplifying the difference, a first capacitor unit connected with an output end of the first SHA and an input end of the amplifier through a first switching unit, a second capacitor unit connected with the input end and an output end of the amplifier through a second switching unit, and a third capacitor unit connected with the input end and the output end of the amplifier through a third switching unit.

14 Claims, 6 Drawing Sheets

U.S. PATENT DOCUMENTS

| | | | |
|---|---|---|---|
| 7,339,512 B2* | 3/2008 | Gulati et al. | 341/172 |
| 7,385,536 B2* | 6/2008 | Kinyua et al. | 341/122 |
| 2005/0140536 A1* | 6/2005 | Waltari | 341/162 |
| 2005/0140537 A1* | 6/2005 | Waltari | 341/162 |
| 2007/0035432 A1* | 2/2007 | Gulati et al. | 341/155 |
| 2009/0289821 A1* | 11/2009 | Li et al. | 341/110 |

OTHER PUBLICATIONS

Jere A. M. Jarvinen et al., "A 12-bit 32 µW Ratio-Independent Algorithmic ADC", 2006 Symposium on VLSI Circuits Digest of Technical Papers, 2006 IEEE.

* cited by examiner

METHOD OF ALGORITHMIC ANALOG-TO-DIGITAL CONVERSION AND ALGORITHMIC ANALOG-TO-DIGITAL CONVERTER

CROSS-REFERENCE TO RELATED APPLICATION

This application claims priority to and the benefit of Korean Patent Application No. 2007-104108, filed Oct. 16, 2007, the disclosure of which is incorporated herein by reference in its entirety.

BACKGROUND

1. Field of the Invention

The present invention relates to a method of algorithmic analog-to-digital conversion and an algorithmic Analog-to-Digital Converter (ADC), and more particularly, to a method and apparatus for efficiently performing analog-to-digital conversion using separate capacitors in an algorithmic ADC.

This work was supported by the IT R&D program of MIC/IITA. [2006-S-006-02. Components/Module technology for Ubiquitous Terminals].

2. Discussion of Related Art

To process an image signal in an image system, a precise analog signal must be converted into a digital signal insensitive to noise. This is performed by an ADC.

Image data output from a sensor is very precise and thus requires a high-resolution ADC capable of recognizing a minute signal. Besides image systems, communication and image processing application systems, such as mobile communications, Asynchronous Digital Subscriber Loops (ADSL), International Mobile Telecommunications-2000 (IMT-2000), digital camcorders and High-Definition Televisions (HDTVs), require a high-performance ADC having a high resolution of 12 bits to 14 bits and a high sampling speed of several tens of MHz.

Among various conventional ADCs, an algorithmic ADC is widely used to optimize a chip size and power consumption.

However, the conventional algorithmic ADC has a problem in the operating speed of a Sample and Hold Amplifier (SHA) due to capacitor-sharing between the SHA and a Multiplying Digital-to-Analog Converter (MDAC).

SUMMARY OF THE INVENTION

The present invention is directed to providing a method and apparatus for algorithmic analog-to-digital conversion.

The present invention is also directed to extending the hold settling time of a Sample and Hold Amplifier (SHA) and freeing a bandwidth to efficiently perform analog-to-digital conversion in an apparatus for algorithmic analog-to-digital conversion.

The present invention is also directed to changing division of a clock to reduce power consumed by an apparatus for algorithmic analog-to digital conversion.

One aspect of the present invention provides An algorithmic Analog-To-Digital converter (ADC), in which a Multiplying Digital-to-Analog Converter (MDAC) is included, the MDAC comprising: a Digital-to-Analog Converter (DAC) for converting a first digital signal into an analog signal; a subtractor for calculating a difference between the signal output from the DAC and an analog signal output from a first Sample and Hold Amplifier (SHA); an amplifier for amplifying the difference; a first capacitor unit connected with an output end of the first SHA and an input end of the amplifier through a first switching unit; a second capacitor unit connected with the input end and an output end of the amplifier through a second switching unit; and a third capacitor unit connected with the input end and the output end of the amplifier through a third switching unit.

The first SHA receives the analog signal, and samples and holds the analog signal. The algorithmic ADC may further comprise at least one flash ADC for converting an analog signal output from the MDAC into a digital signal and outputting the first digital signal to the MDAC.

The MDAC further comprises, a second SHA for sampling and holding an analog signal input from outside to the MDAC. The algorithmic ADC further comprise a digital error correction logic for receiving the signal output from the flash ADC and correcting an error of the signal. The first, second and third switching units operate according to a clock signal received from outside. The algorithmic ADC further comprise a clock generator for providing a clock signal to the respective switching units. The clock generator generates a clock signal using a Phase-Locked Loop (PLL) circuit and divides the clock signal into clock signals corresponding to the respective switching units using at least one divider.

Another aspect of the present invention provides a method of algorithmic analog-to-digital conversion, comprising: a receiving an analog signal, sampling the analog signal at a Sample and Hold Amplifier (SHA), and storing the analog signal in a first capacitor unit; an inputting the signal stored in the first capacitor unit to an amplifier, and storing a signal amplified by the amplifier in a second capacitor unit; an inputting the signal stored in the second capacitor unit to the amplifier, storing a signal amplified by the amplifier in a third capacitor unit, and outputting the amplified signal to a flash Analog-to-Digital Converter (ADC); a calculating a difference between a signal received from the flash ADC and the signal stored in the third capacitor unit, and storing the difference in the third capacitor unit again; an inputting the signal stored in the third capacitor unit to the amplifier, storing an output amplified by the amplifier in the second capacitor unit, and outputting the output to the flash ADC; a calculating a difference between a signal received from the flash ADC and the signal stored in the second capacitor unit, and storing the difference in the second capacitor unit again; and an inputting the signal stored in the second capacitor unit to the amplifier, storing an output amplified by the amplifier in the third capacitor unit, and outputting the output to the flash ADC.

An inputting the signal stored in the third capacitor unit to the amplifier, storing an output amplified by the amplifier in the second capacitor unit, and outputting the output to the flash ADC; a calculating a difference between a signal received from the flash ADC and the signal stored in the second capacitor unit, and storing the difference in the second capacitor unit again; and an inputting the signal stored in the second capacitor unit to the amplifier, storing an output amplified by the amplifier in the third capacitor unit, and outputting the output to the flash ADC are repeatedly performed according to a digital resolution. The repetition period of inputting the signal stored in the third capacitor unit to the amplifier, storing an output amplified by the amplifier in the second capacitor unit, and outputting the output to the flash ADC is larger than a repetition period of calculating a difference between a signal received from the flash ADC and the signal stored in the second capacitor unit, and storing the difference in the second capacitor unit again, and the repetition period of calculating a difference between a signal received from the flash ADC and the signal stored in the second capacitor unit, and storing the difference in the second capacitor unit again is larger than a repetition period of inputting the signal stored in the second capacitor unit to the amplifier, storing an output amplified by the amplifier in the third capacitor unit, and outputting the output to the flash ADC. The repetition periods of inputting the signal stored in the third capacitor unit to the amplifier, storing an output amplified by the amplifier in the second capacitor unit, and outputting the output to the flash ADC to inputting the signal stored in the second capacitor unit to the amplifier, storing an output amplified by the amplifier in the third capacitor unit, and outputting the output to the flash ADC are generated by a Phase-Locked Loop (PLL) circuit and correspond to clock periods divided by at least one divider.

The first capacitor unit is connected with the SHA and an input end of the amplifier through a switch, and the switch is operated by a clock signal received from outside. The second and third capacitor units are connected with an input end and an output end of the amplifier through a switch, and the switch is operated by a clock signal received from outside.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Figure 1:
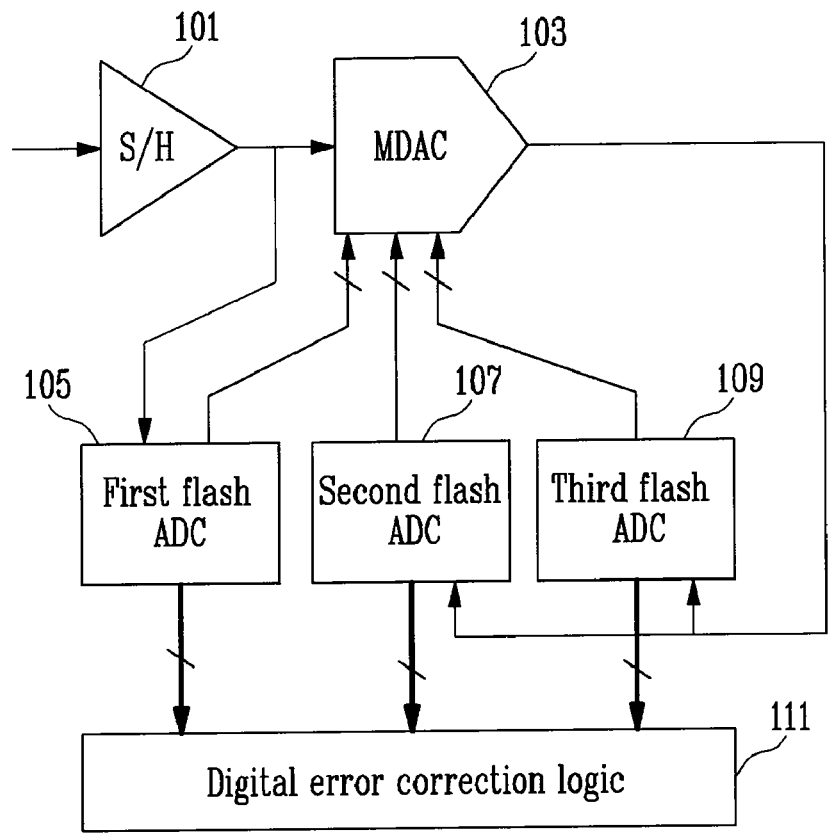
FIG. 1 is a block diagram of an algorithmic Analog-to-Digital Converter (ADC) according to an exemplary embodiment of the present invention.

FIG. 1 is a block diagram of an algorithmic Analog-to-Digital Converter (ADC) according to an exemplary embodiment of the present invention.

Referring to FIG. 1, the algorithmic ADC employing the present invention includes a Sample and Hold Amplifier (SHA) 101, a Multiplying Digital-to-Analog Converter (MDAC) 103, first, second and third flash ADCs 105, 107 and 109, and a digital error correction logic 111.

The SHA 101 functions to sample and hold an analog signal received from outside, which is required for a pipeline ADC and an algorithmic ADC.

The MDAC 103 functions to calculate a difference between an analog signal of a previous stage and a digital signal of a current stage, amplify the difference, and output the amplified difference to a next stage. Constitution of the MDAC 103 will be described in detail with reference to FIG. 2.

Lately, the first to third flash ADCs 105 to 107 are most widely used due to high processing speed. However, a circuit consisting of such flash ADCs only is unrealistic because power consumption is too high and a size is too large.

The digital error correction logic 111 functions to correct an error of signals output from the flash ADCs 105 to 107, and output an n-bit digital signal.

Figure 2:
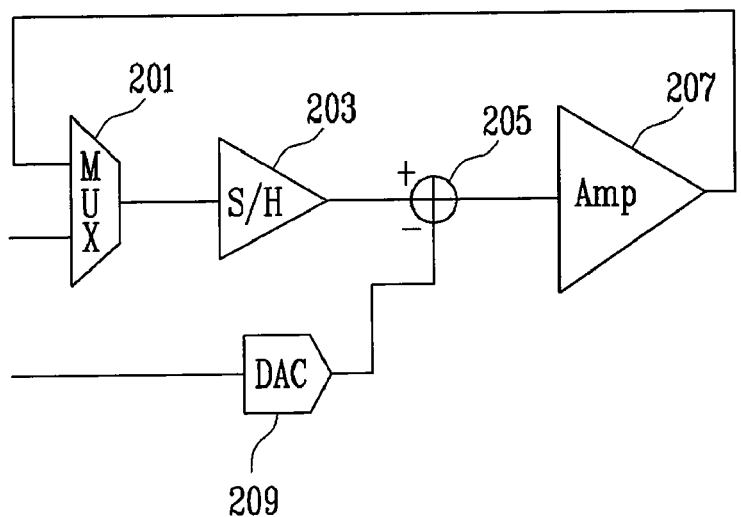
FIG. 2 is a block diagram of a Multiplying Digital-to-Analog Converter (MDAC) employing the present invention.

FIG. 2 is a block diagram of an MDAC employing the present invention.

Referring to FIG. 2, the MDAC includes a Multiplexer (MUX) 201, an SHA 203, a subtractor 205, an MDAC amplifier 207 and a Digital-to-Analog Converter (DAC) 209.

The MUX 201 functions to multiplex an analog signal received from outside by the MDAC and a signal output from the MDAC amplifier 207, and output the analog signals.

The SHA 203 functions to receive a signal from the MUX 201 and sample and hold the signal. The SHA 203 is included in the MDAC to stabilize operation of the MDAC.

The subtractor 205 functions to calculate a difference between a signal received from the SHA 203 and a signal received from the DAC 209. Since the MDAC functions to amplify a difference between an input analog signal and a converted digital signal and feed back the difference, the subtractor 205 functions to calculate the difference between an analog signal received from the SHA 203 and a signal received from the DAC 209.

The MDAC amplifier 207 functions to amplify a difference signal generated from the subtractor 205 and feed back the amplified signal. According to how many times the feedback occurs, the whole operation period of an ADC is determined, and the resolution of the ADC may be determined according to the operation period.

The DAC 209 functions to convert again digital signals output from the flash ADCs described with reference to FIG. 1 into analog signals. This is so that the subtractor 205 can compare signals with each other and calculate a difference between the signals.

The MDAC shown in FIG. 2 looks similar to a conventional MDAC but has a notable difference in the use of capacitors storing signals at the respective components. In a conventional MDAC, the same capacitor stores a signal fed back from the amplifier 207 and a signal output from the SHA 203. On the other hand, in an exemplary embodiment of the present invention, a capacitor storing a signal input to the amplifier 207 and a signal output from the amplifier 207 is separated from a capacitor storing a signal output from the SHA 203, thereby enabling efficient conversion. This will be described below with reference to the drawings.

Figure 3:
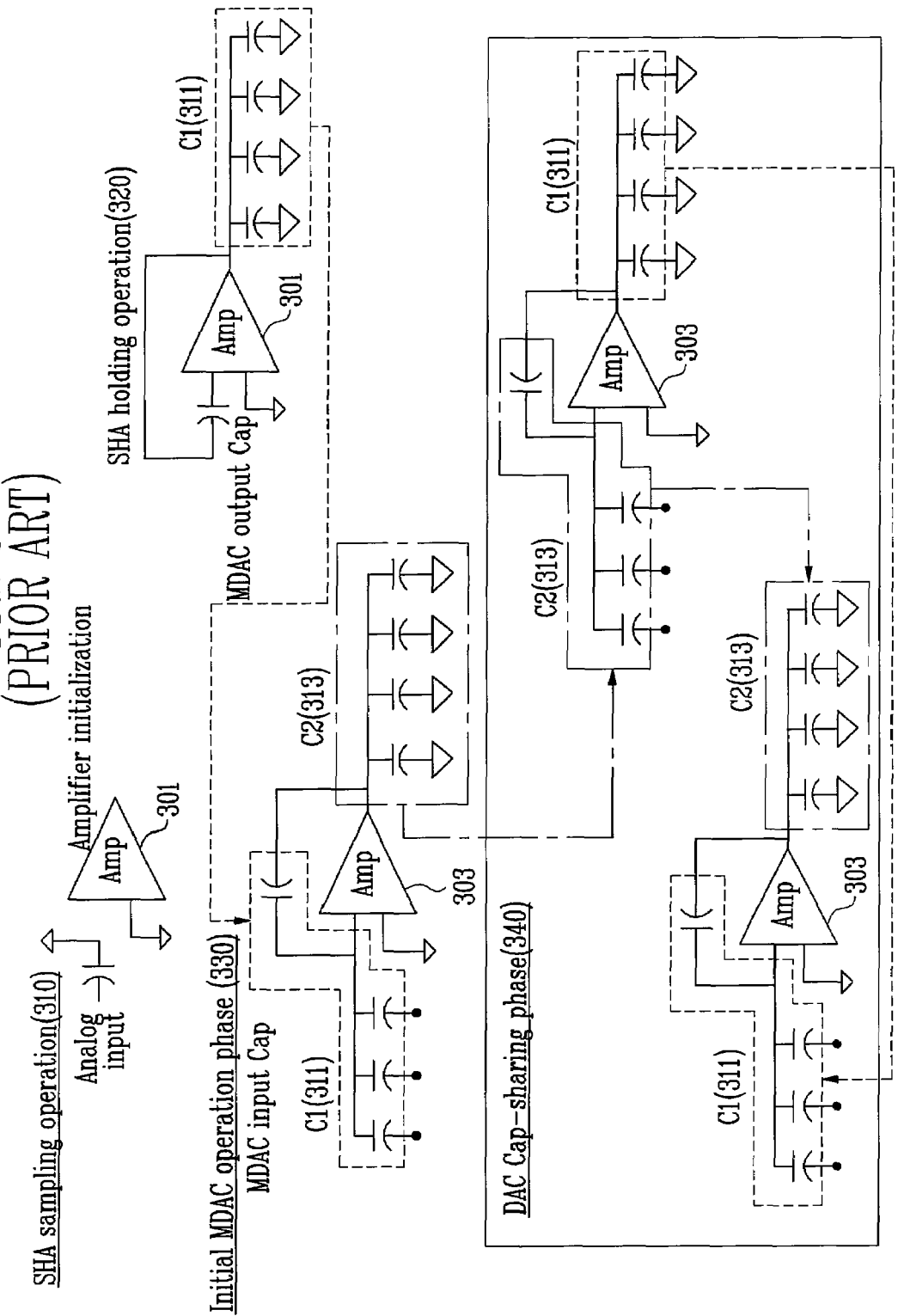
FIG. 3 illustrates a conventional algorithmic analog-to-digital conversion process compared with the present invention.

FIG. 3 illustrates a conventional algorithmic analog-to-digital conversion process compared with the present invention.

Referring to FIG. 3, when an analog signal is received, an SHA performs a sampling operation 310. During the operation, an amplifier 301 included in the SHA is initialized, and the analog input is sampled by a capacitor at an analog input end shown in the reference number 310.

Subsequently, the SHA performs a holding operation 320. During the holding operation, the input signal is applied to the amplifier 301 of the SHA, and an output signal is stored in a C1 capacitor unit 311.

Subsequently, in an initial MDAC operation phase 330, the signal is applied to an amplifier 303 for MDAC operation. To this end, through a switching operation, the C1 capacitor unit 311 cuts off a connection with the amplifier 301 of the SHA and is connected with the MDAC amplifier 303.

The signal input from the C1 capacitor unit 311 is amplified by the MDAC amplifier 303 and stored in a C2 capacitor unit 313. In addition, the output signal is output to an external ADC circuit, and thus an ADC value is output.

Subsequently, in an MDAC-capacitor-sharing phase 340, the output signal of the MDAC amplifier 303 stored in the C2 capacitor unit 313 is input again to the MDAC amplifier 303 through the switching operation, and the C2 capacitor unit 313 receives the signal output from the external ADC. Here, the C2 capacitor unit 313 is connected with the external ADC and naturally serves as a subtractor as well as a DAC. The MDAC amplifier 303, which receives again the signal output from the C2 capacitor unit 313, outputs its output to the C1 capacitor unit 311. This process is repeated until an analog-to-digital conversion process is completed to obtain a previously determined resolution.

More specifically, the C1 capacitor unit 311 and the C2 capacitor unit 313 storing the input and output signals of the MDAC amplifier 303 are switched with each other for n bits and store input and output signals.

Since the C1 capacitor unit 311 stores an initial output signal of the SHA, a signal must not be stored in the C1 capacitor unit 311 to start the holding operation of the SHA upon reception of a next signal. However, according to the above-described process, entire ADC operations must be completed to prevent a signal from being stored in the C1 capacitor unit 311. Thus, it is difficult to efficiently perform continuous operations.

Figure 4:
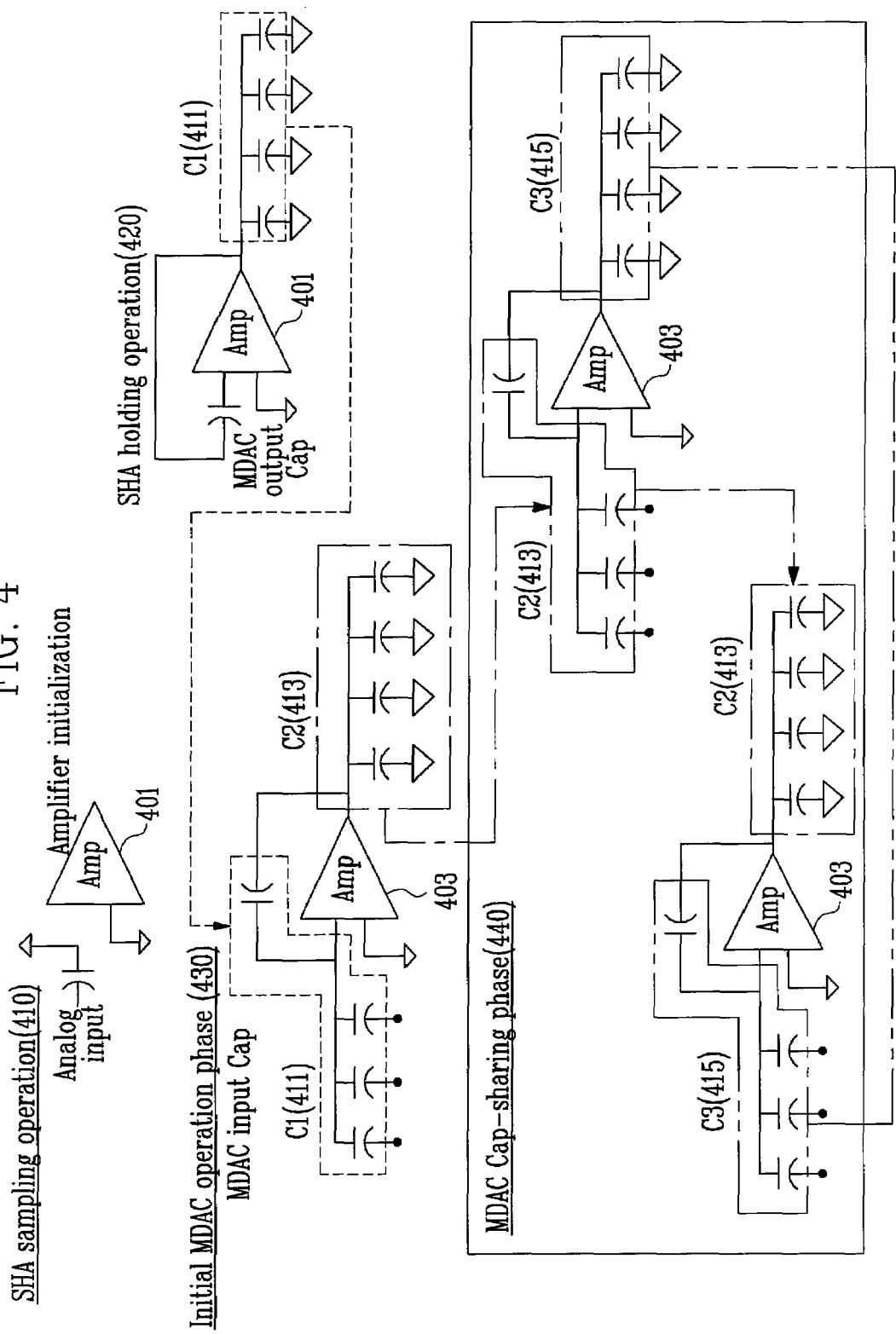
FIG. 4 illustrates an algorithmic analog-to-digital conversion process according to an exemplary embodiment of the present invention.

FIG. 4 illustrates an algorithmic analog-to-digital conversion process according to an exemplary embodiment of the present invention.

Referring to FIG. 4, when an analog signal is received, an SHA performs a sampling operation 410. During the operation, an amplifier 401 included in the SHA is initialized, and the analog input is sampled by a capacitor at an analog input end shown in the reference number 410.

Subsequently, the SHA performs a holding operation 420. During the holding operation, the input signal is applied to the amplifier 401 of the SHA, and an output signal is stored in a C1 capacitor unit 411.

Subsequently, in an initial MDAC operation phase 430, the signal is applied to an amplifier 403 for MDAC operation. To this end, through a switching operation, the C1 capacitor unit 411 cuts off a connection with the amplifier 401 of the SHA and is connected with the MDAC amplifier 403.

The signal input from the C1 capacitor unit 411 is amplified by the MDAC amplifier 403 and stored in a C2 capacitor unit 413. In addition, the output signal is output to an external ADC circuit, and thus an ADC value is output.

Subsequently, in an MDAC-capacitor-sharing phase 440, the output signal of the MDAC amplifier 403 stored in the C2 capacitor unit 413 is input again to the MDAC amplifier 403 through the switching operation, and the C2 capacitor unit 413 receives the signal output from the external ADC. Here, the C2 capacitor unit 413 is connected with the external ADC and naturally serves as a subtractor as well as a DAC. The MDAC amplifier 403, which receives again the signal output from the C2 capacitor unit 413, outputs its output to a C3 capacitor unit 415.

That is, unlike in the conventional process, the C3 capacitor unit 415 stores the initial output signal of the MDAC amplifier 403 in the MDAC-capacitor-sharing phase 440.

Subsequently, the operations of the C2 capacitor unit 413 and the C3 capacitor unit 415 are repeated until an analog-to-digital conversion process is completed to obtain a previously determined resolution, like the conventional process.

Since the C1 capacitor unit 411 storing the initial output signal of the SHA is separated from the C2 and C3 capacitor units 413 and 415 performing the MDAC-sharing operation, the SHA amplifier 401 can receive an input signal, perform the holding operation 420 and store the output while the MDAC-sharing operation is performed. Consequently, it is possible, unlike in the conventional process, to efficiently perform continuous operations.

In this structure particularly, capacitor values of the C2 and C3 capacitor units 413 and 415 can be changed according to the number of output bits, and thus it is possible to minimize the entire power consumption of an ADC.

Figure 5:
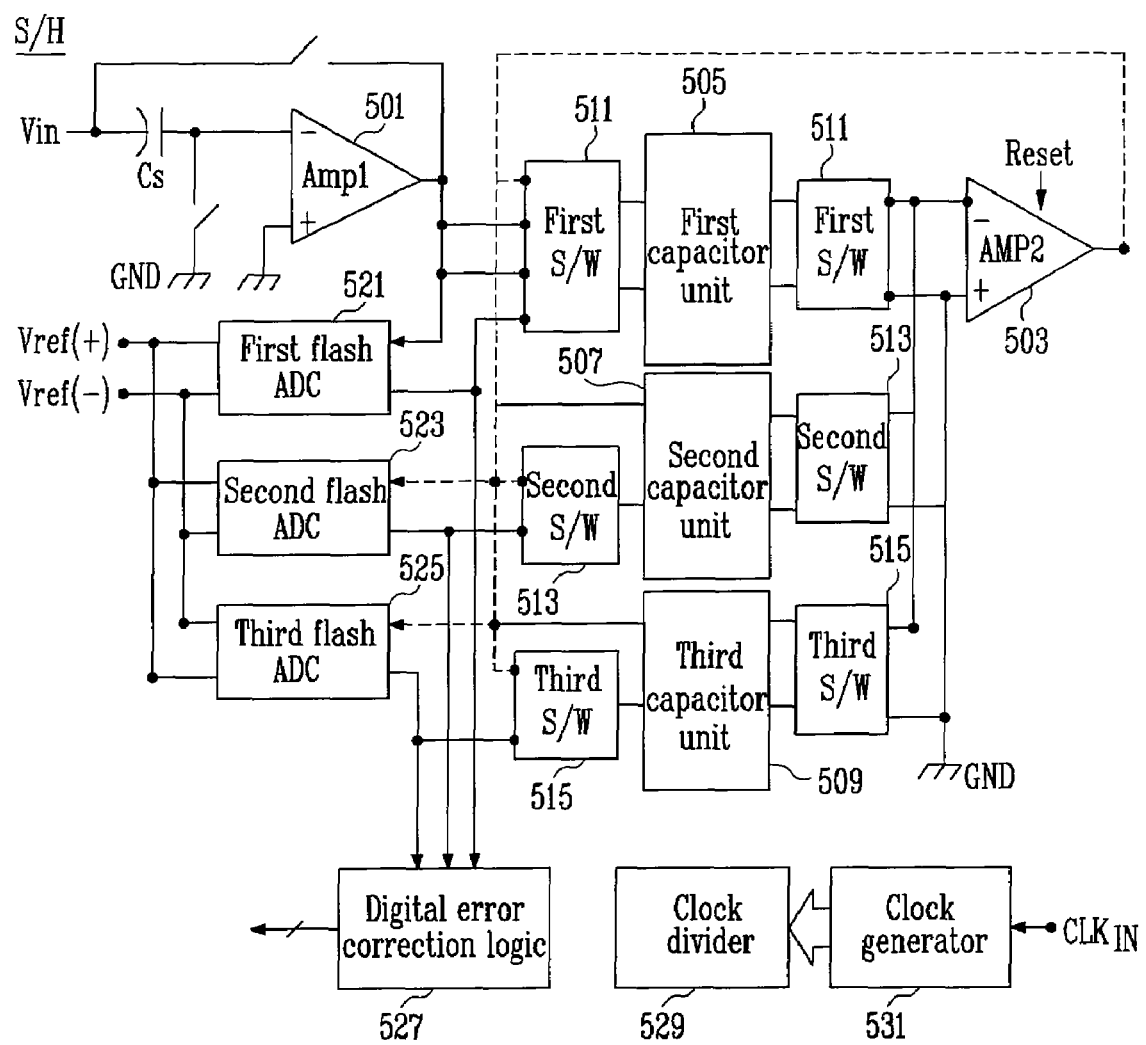
FIG. 5 is a block diagram of an algorithmic ADC according to an exemplary embodiment of the present invention.

FIG. 5 is a block diagram of an algorithmic ADC according to an exemplary embodiment of the present invention.

An MDAC part is shown in detail in FIG. 5. Referring to FIG. 5, an analog signal $V_{in}$ input from outside is sampled by an SHA amplifier 501 and held by the capacitor $C_s$, and the held signal is input to a first capacitor unit 505 by a switching operation of a first switching unit 511. Subsequently, the signal of the first capacitor unit 505 switched and input to an MDAC amplifier 503 is again input to a second capacitor unit 507 according to a switching operation of a second switching unit 513, and again input to a third capacitor unit 509 according to a switching operation of a third switching unit 515. Then, the second and third capacitor units 507 and 509 are connected with an input end and an output end of the MDAC amplifier 503 according to operation of the second and third switching units 513 and 515 and perform an n-bit analog-to-digital conversion operation. Here, signals input from respective flash ADCs 521, 523 and 525 are input to the respective capacitor units 505, 507 and 509 according to switching operation of the respective switching units 511, 513 and 515, and thus analog-to-digital conversion and a subtraction operation are performed naturally.

Every time output results of respective bits are output, the respective capacitor units 505, 507 and 509 output the results to a digital error correction logic 527, and the digital error correction logic 527 stores all the results to correct an error and outputs a complete n-bit ADC result to outside.

In addition, a clock for making the respective switching units 511, 513 and 515 perform operation is generated from a clock generator 531, and a clock divider 529 divides the generated reference clock to provide accurate points in time for operation to the respective switching units 511, 513 and 515 according to the reference clock.

Figure 6:
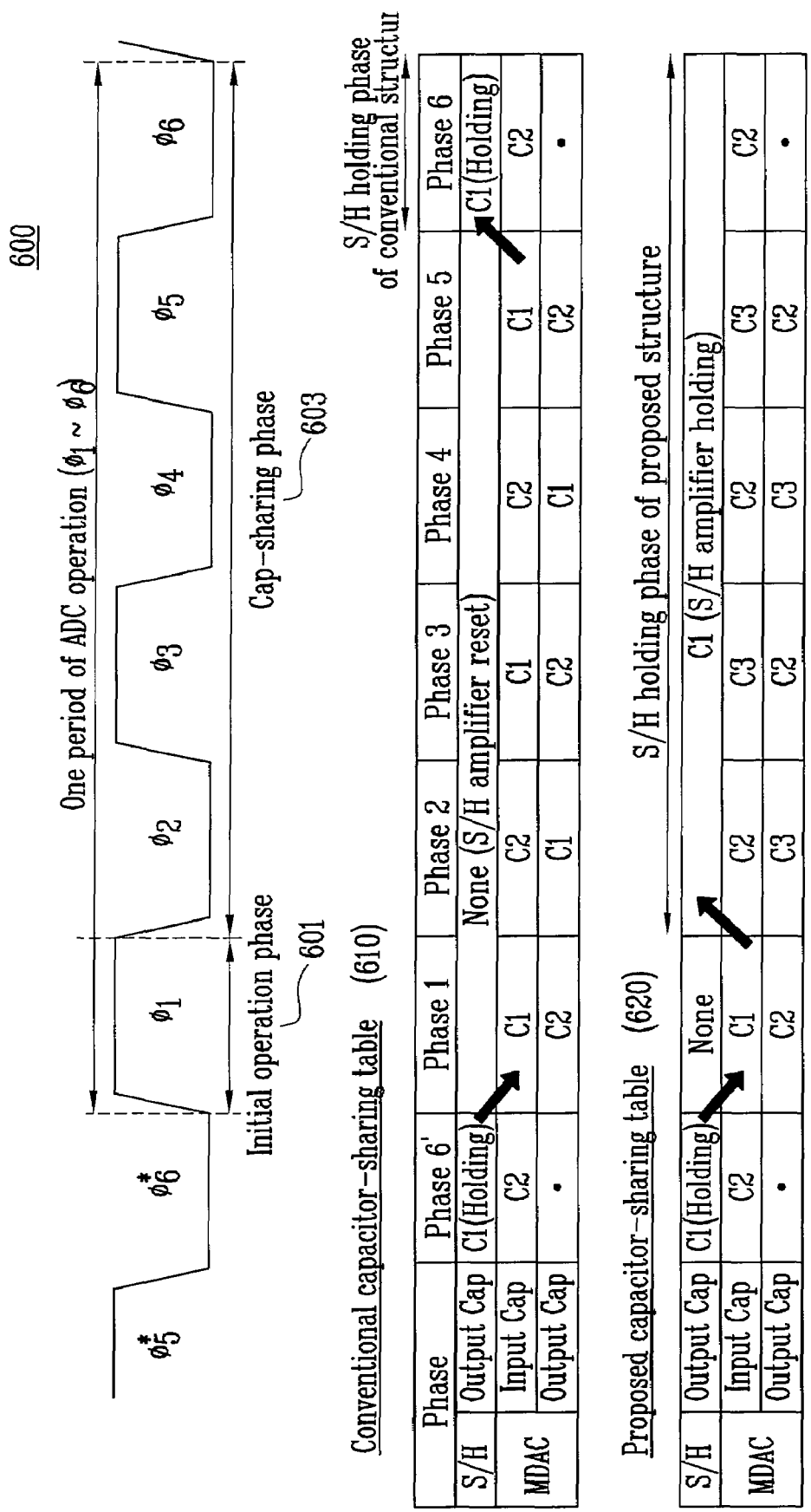
FIG. 6 shows tables of a conventional capacitor-sharing operation and a capacitor-sharing operation according to an exemplary embodiment of the present invention.

FIG. 6 shows tables of a conventional capacitor-sharing operation and a capacitor-sharing operation according to an exemplary embodiment of the present invention.

Referring to FIG. 6, a timing diagram 600 is illustrated, which shows a reference clock signal during one operation of an ADC. An initial operation phase 601 denotes the initial MDAC operation phase of FIGS. 3 and 4, and a capacitor-sharing phase 603 denotes the MDAC-capacitor-sharing phase of FIGS. 3 and 4.

According to the conventional capacitor-sharing operation, the holding operation of a C1 capacitor of an SHA is enabled only in phase 6, as seen from Table 610. In an MDAC-sharing phase, the C1 capacitor operates as input and output capacitors and thus cannot store an SHA signal.

On the other hand, according to the capacitor-sharing operation of the present invention, a held signal of an SHA can be stored in every phase except an initial operation phase, i.e., phase 1, as seen from Table 620. This is because the C1 capacitor unit receiving the held signal of the SHA is not used in the MDAC-capacitor-sharing phase according to the present invention.

When the C1 capacitor unit is not used in the MDAC-sharing phase, an available time for receiving the held signal of the SHA is extended, and thus it is possible to increase the operating speed of the SHA. In addition, a problem that the capacitance of a capacitor cannot be reduced due to capacitor sharing during operation of the SHA and the MDAC, is solved, and thus it is possible to reduce power consumption.

The bandwidth of an SHA may be determined by an equation $$f_{-3dB} = \frac{1}{2\pi t_{settling}}.$$

In the conventional MDAC, the output signal of the SHA must be processed within phase 6. Thus, $t_{settling}$ of the above equation is small, and the bandwidth of the SHA must be wide. According to an exemplary embodiment of the present invention, however, an available time for receiving the output signal of the SHA is much longer than that of the conventional art, and thus the bandwidth of the SHA is relatively unrestricted.

In addition, the capacitance of a capacitor at the input and output ends of an MDAC is determined according to a relationship between the Noise Figure (NF) of the capacitor and quantization noise, which means that the capacitance of the capacitor may become smaller as conversion phases are further performed. For example, when a 12-bit algorithmic analog-to-digital signal converter converts a digital value by two bits through six conversion phases, a resolution value to be considered in sampling decreases by 2 bits to be 10 bits, 8 bits and 6 bits. Consequently, the further the conversion phases are performed, the smaller the capacitance of the capacitor required at the output end of the MDAC becomes.

In other words, the later a conversion phase, the smaller a required capacitance of a capacitor connected with the output end of the MDAC becomes. Therefore, the bandwidth of an amplifier may increase due to the inverse proportional relationship between the bandwidth of an amplifier and the capacitance of the capacitor. Thus, a time for settling a signal at the output end may be reduced, which means that the later a conversion phase, the higher a conversion rate may be.

Consequently, by separating capacitor units according to an exemplary embodiment of the present invention, an operation time can vary according to conversion phases, which are difficult to use when a capacitor unit is conventionally shared between an SHA and the MDAC. In the result, power consumption can be reduced.

Figure 7:
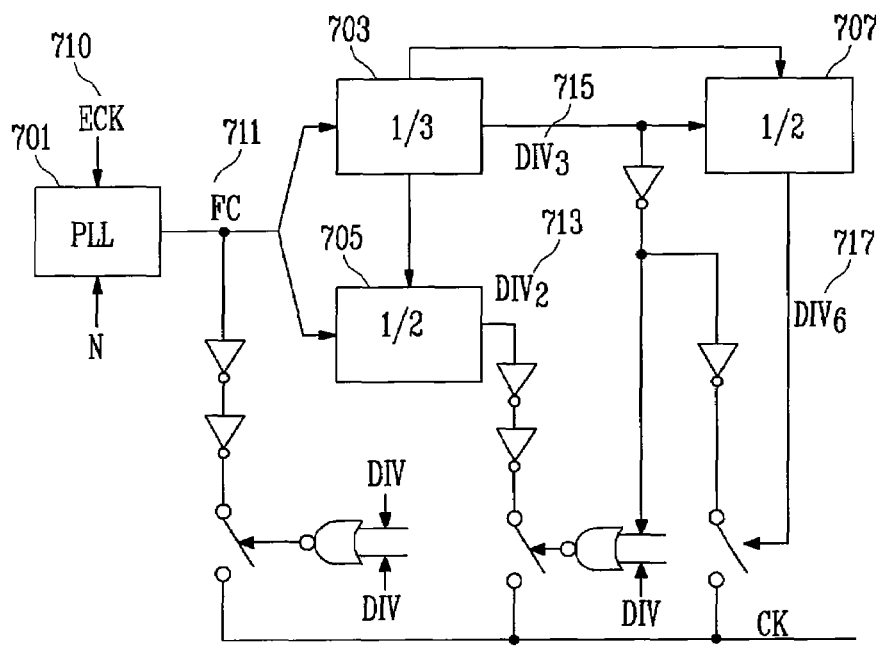
FIG. 7 is a circuit diagram of a clock divider applied to an exemplary embodiment of the present invention.
Figure 8:
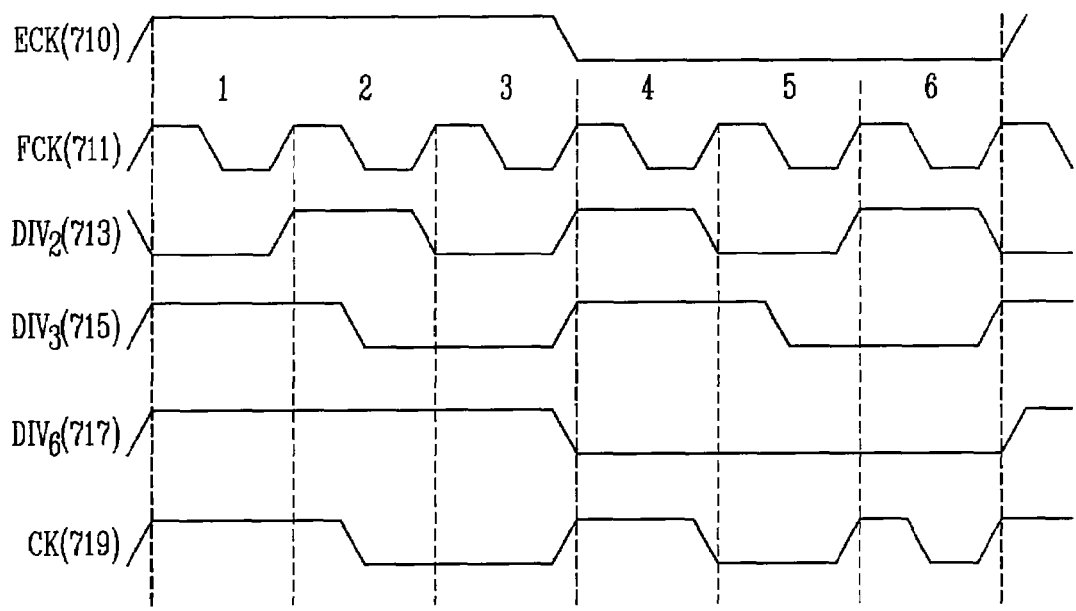
FIG. 8 is a timing diagram showing clocks generated from the circuit of FIG. 7.

FIG. 7 is a circuit diagram of a clock divider applied to an exemplary embodiment of the present invention, and FIG. 8 is a timing diagram showing clocks generated from the circuit of FIG. 7.

Referring to FIG. 7, when a clock (710) is input from an external clock generator, a clock that is n times of the clock input from outside is generated from a Phase-Locked Loop (PLL) circuit 701. FIG. 8 shows examples of a case in which n is 6, and an output value of the case can be detected at an FC node 711 of FIG. 7.

Subsequently, the clock signal multiplied by n is divided through a ⅓ division circuit 703 and a ½ division circuit 705. The divided values may be detected at a $DIV_2$ node 713 and a $DIV_3$ node 715, respectively. In addition, the signal divided by three passes through the ½ division circuit 707 also, and thus a signal divided by six is output. The output may be detected at a $DIV_6$ node 717.

As seen from the circuit of FIG. 7, all the divided signals are appropriately combined for a capacitor stage in an exemplary embodiment of the present invention using a switch, a buffer, etc., such that a final CK signal 719 is output.

As seen from FIG. 8, the CK clock signal 719 has a large period in an initial conversion phase and a smaller period in a later conversion phase. Unlike a conventional method, it is possible to provide a clock having a shorter period as conversion phases are performed, such that power consumed by a capacitor can be reduced.

According to the present invention, it is possible to provide a method and apparatus for algorithmic analog-to-digital conversion.

In addition, it is possible to extend a hold settling time of an SHA and free a bandwidth and thereby perform an efficient analog-to-digital conversion process in an apparatus for algorithmic analog-to-digital conversion.

Furthermore, it is possible to change division of a clock to reduce power consumed by an apparatus for algorithmic analog-to-digital conversion.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An algorithmic Analog-To-Digital converter (ADC) having an external ADC circuit and a Multiplying Digital-to-Analog Converter (MDAC), the MDAC comprising:

a Digital-to-Analog Converter (DAC) for converting a first digital signal into an analog signal;

a subtractor for calculating a difference between the signal output from the DAC and an analog signal output from a first Sample and Hold Amplifier (SHA);

an amplifier for amplifying the difference;

a first capacitor unit connected with an output end of the first SHA and an input end of the amplifier through a first switching unit;

a second capacitor unit connected with the input end and an output end of the amplifier through a second switching unit; and a third capacitor unit connected with the input end and the output end of the amplifier through a third switching unit, wherein the first capacitor is configured to receive a signal from the first SHA and output the signal to the amplifier to be amplified, wherein the amplifier is configured to output the amplified signal to the second capacitor and to the external ADC circuit, so that the amplified signal stored in the second capacitor can be feedback to the amplifier and an output from the external ADC circuit can be provided to the second capacitor, and wherein the third capacitor is configured to receive an output signal from the amplifier, where the output signal is generated by the amplifier according to the feedback signal received from the second capacitor.

2. The algorithmic ADC of claim 1, wherein the first SHA receives the analog signal, and samples and holds the analog signal.

3. The algorithmic ADC of claim 1, further comprising: a plurality of external ADC circuits, each external ADC circuit being configured to convert an analog signal output from the MDAC into a digital signal and output the first-digital signal to the MDAC.

4. The algorithmic ADC of claim 1, wherein the MDAC further comprises: a second SHA for sampling and holding an analog signal input from outside to the MDAC.

5. The algorithmic ADC of claim 3, further comprising: a digital error correction logic for receiving the signal output from the flash ADC and correcting an error of the signal.

6. The algorithmic ADC of claim 1, wherein the first, second and third switching units operate according to a clock signal received from outside.

7. The algorithmic ADC of claim 1, further comprising: a clock generator for providing a clock signal to the respective switching units.

8. The algorithmic ADC of claim 7, wherein the clock generator generates a clock signal using a Phase-Locked Loop (PLL) circuit and divides the clock signal into clock signals corresponding to the respective switching units using at least one divider.

9. A method of algorithmic analog-to-digital conversion, comprising:
receiving an analog signal, sampling the analog signal at a Sample and Hold Amplifier (SHA), and storing the analog signal in a first capacitor unit;
inputting the signal stored in the first capacitor unit to an amplifier, and storing a signal amplified by the amplifier in a second capacitor unit;
inputting the signal stored in the second capacitor unit to the amplifier, storing a signal amplified by the amplifier in a third capacitor unit, and outputting the amplified signal to a flash Analog-to-Digital Converter (ADC);
calculating a difference between a signal received from the flash ADC and the signal stored in the third capacitor unit, and storing the difference in the third capacitor unit again;
inputting the signal stored in the third capacitor unit to the amplifier, storing an output amplified by the amplifier in the second capacitor unit, and outputting the output to the flash ADC;
calculating a difference between a signal received from the flash ADC and the signal stored in the second capacitor unit, and storing the difference in the second capacitor unit again; and
inputting the signal stored in the second capacitor unit to the amplifier, storing an output amplified by the amplifier in the third capacitor unit, and outputting the output to the flash ADC.

10. The method of claim 9, wherein inputting the signal stored in the third capacitor unit to the amplifier, storing an output amplified by the amplifier in the second capacitor unit, and outputting the output to the flash ADC;
calculating a difference between a signal received from the flash ADC and the signal stored in the second capacitor unit, and storing the difference in the second capacitor unit again; and inputting the signal stored in the second capacitor unit to the amplifier, storing an output amplified by the amplifier in the third capacitor unit, and outputting the output to the flash ADC are repeatedly performed according to a digital resolution.

11. The method of claim 9, wherein a repetition period of inputting the signal stored in the third capacitor unit to the amplifier, storing an output amplified by the amplifier in the second capacitor unit, and outputting the output to the flash ADC is larger than a repetition period of calculating a difference between a signal received from the flash ADC and the signal stored in the second capacitor unit, and storing the difference in the second capacitor unit again, and the repetition period of calculating a difference between a signal received from the flash ADC and the signal stored in the second capacitor unit, and storing the difference in the second capacitor unit again is larger than a repetition period of inputting the signal stored in the second capacitor unit to the amplifier, storing an output amplified by the amplifier in the third capacitor unit, and outputting the output to the flash ADC.

12. The method of claim 9, wherein repetition periods of inputting the signal stored in the third capacitor unit to the amplifier, storing an output amplified by the amplifier in the second capacitor unit, and outputting the output to the flash ADC to inputting the signal stored in the second capacitor unit to the amplifier, storing an output amplified by the amplifier in the third capacitor unit, and outputting the output to the flash ADC are generated by a Phase-Locked Loop (PLL) circuit and correspond to clock periods divided by at least one divider.

13. The method of claim 9, wherein the first capacitor unit IS connected with the SHA and an input end of the amplifier through a switch, and the switch is operated by a clock signal received from outside.

14. The method of claim 9, wherein the second and third capacitor units are connected with an input end and an output end of the amplifier through a switch, and the switch is operated by a clock signal received from outside.

* * * * *